(12) United States Patent
Choi

(10) Patent No.: US 6,496,073 B2
(45) Date of Patent: Dec. 17, 2002

(54) DIGITALLY CONTROLLED BIAS CIRCUIT FOR AMPLIFIERS

(75) Inventor: Kevin Choi, Thousand Oaks, CA (US)

(73) Assignee: Skyworks Solutions, Inc., Newport Beach, CA (US)

( * ) Notice: Subject to any disclaimer, the term of this patent is extended or adjusted under 35 U.S.C. 154(b) by 21 days.

(21) Appl. No.: 09/817,668

(22) Filed: Mar. 26, 2001

(65) Prior Publication Data

US 2002/0135426 A1 Sep. 26, 2002

(51) Int. Cl.[7] .................................................. H03F 3/04
(52) U.S. Cl. ........................................ 330/296; 330/285
(58) Field of Search .................................. 330/296, 285

(56) References Cited

U.S. PATENT DOCUMENTS

| | | | |
|---|---|---|---|
| 4,305,044 A | * 12/1981 | Leidich | 330/285 |
| 5,670,912 A | * 9/1997 | Zocher | 330/296 |
| 5,724,004 A | * 3/1998 | Reif et al. | 330/296 |
| 6,144,259 A | * 11/2000 | Kirisawa | 330/296 |
| 6,304,130 B1 | * 10/2001 | Poulin et al. | 330/296 |

* cited by examiner

Primary Examiner—Robert Pascal
Assistant Examiner—Khanh Van Nguyen
(74) Attorney, Agent, or Firm—Thomas, Kayden, Horstemeyer & Risley, LLP

(57) ABSTRACT

Power gain and quiescent current of a radio frequency (RF) transistor is controlled by a current draw-away circuit that diverts ("draws away") a portion of the reference current from a reference transistor residing in an RF transistor bias circuit. When in the "off" state, the current draw-away circuit is not conductive. When in the "on" state, a transistor residing in the current draw-away circuit is conducting and draws a draw-away current, $I_{DRAW}$, through a resistor. The magnitude of $I_{DRAW}$ is determined by the resistor. Other embodiments include a variable resistance that varies $I_{DRAW}$, a variable current source (or variable voltage source) that varies $I_{DRAW}$ by adjusting the current (or voltage) applied to the control input of the transistor residing in the current draw-away circuit, and two or more current draw-away circuits individually controlled such that one or any combination of the current draw-away circuits varies $I_{DRAW}$.

34 Claims, 8 Drawing Sheets

DIGITALLY CONTROLLED BIAS CIRCUIT FOR AMPLIFIERS

BACKGROUND OF THE INVENTION

1. Field of the Invention

This invention is generally related to amplifiers. More particularly, it is related to controlling bias current of an amplifier.

2. Related Art

With the increasing power efficiency demands from users of mobile communication devices, such as cell phones and the like, mobile communication device manufactures are continually searching for ways to improve power consumption efficiency within the mobile communication device, thereby increasing the useful operating period that a mobile communication device gets from a single charge of the power supply. During a normal voice conversation by a person using the mobile communication device, the transmitting function consumes a very large amount of available power. Therefore, transmitter energy conservation is important. One illustrative example of energy conservation in a transmitter is to configure the transmitter to transmit at a lower power level when the mobile communication device is near a base station. The transmitter is then configured to transmit at a higher power level when the mobile communication device is further away from the base station. This may be accomplished by controlling the radio frequency (RF) drive to the amplifier(s), adjusting the reference voltage and/or current applied to the amplifier bias circuit, or both. Other mobile communication devices may select the most efficient transmission frequencies under actual operating conditions. Other energy conservation techniques have focused on improving energy efficiency of the individual electrical components within the mobile communication device, such as using a high efficiency antenna system.

Conventional amplifiers employing transistors, such as bipolar transistors, heterojunction bipolar transistors or the like, draw a substantially constant collector current ($I_{RF}$) through a radio frequency (RF) transistor when in operation because the reference current ($I_{REF}$) and the collector voltage Vcc applied to the RF transistor are substantially constant during brief periods of operating time. However, because Vcc is typically supplied by a power supply having a limited power capacity, Vcc decreases as the power supply is discharged during device use. Ability to adjust the current $I_{RF}$ drawn by a reference transistor is desirable so that the quiescent current of the RF transistor ($I_{RFO}$) can be varied depending upon the input applied to the amplifier. Conventional methods of adjusting $I_{RF}$ have employed additional circuitry and/or logic to adjust $I_{REF}$ (or $V_{REF}$). This additional circuitry and/or logic is complex, expensive and utilizes the limited power supply. Thus, the additional circuitry and/or logic that regulates $I_{REF}$ (and/or $V_{REF}$) increases the rate of power discharge and shortens the available useful operating life of the mobile communication device for a single power supply cycle. Furthermore, the additional circuitry is often provided on separate circuit boards or control dies, thereby requiring additional space within the device. In a mobile communication device, overall size is important as smaller devices are more desirable in the marketplace. Thus, a need exists in the industry to provide a smaller, inexpensive way of controlling the output of a power amplifier without the use of expensive additional components or sacrifices in power efficiency caused by additional control circuitry and/or logic.

SUMMARY

Power to an amplifier may be controlled by adjusting the reference current (or reference voltage) applied to the bias circuit, that in turn sets the input terminal voltage on the input of an amplifier transistor. In a hand-held communications device, such as a cell phone or the like, the amplifier transistor is often referred to as the radio frequency (RF) transistor. Typically, power is provided by a power supply, such as, but not limited to, a battery, fuel cell and/or solar panel.

Briefly described, a current draw-away circuit employs a transistor to change the current applied to the reference transistor, that in turn sets the voltage applied to the current sinking terminal (collector) of the amplifier transistor, by diverting a portion of the reference current (or reference voltage) from the current sinking terminal of the reference transistor. Hence, the current draw-away circuit "draws away" a portion of the current sinking terminal current. Since the reference current is not directly adjusted, the need for additional complex, expensive and power consuming control circuitry is eliminated.

The current draw-away circuit is coupled to the current sinking terminal of the amplifier transistor. When in the "off" state, a transistor residing in the current draw-away circuit is not conductive. When in the "on" state, the transistor residing in the current draw-away circuit is conductive and draws a draw-away current, $I_{DRAW}$. The magnitude of $I_{DRAW}$ is determined by specifying a resistor coupled to the transistor residing in the current draw-away circuit.

In another embodiment, a device having a variable resistance is employed such that the magnitude of $I_{DRAW}$ can be varied in accordance with variations in resistance. In another embodiment, the magnitude of $I_{DRAW}$ is varied by adjusting the current applied to a control input of the transistor residing in the current draw-away circuit. The variable current is provided by a variable current source. In yet another embodiment, the magnitude of $I_{DRAW}$ is varied by adjusting the voltage applied to control input of the transistor residing in the current draw-away circuit. The variable voltage is provided by a variable voltage source. Another embodiment employs two or more current draw-away circuits. The draw-away circuits may be individually controlled such that one current draw-away circuit is conducting, or any number and/or any combination of current draw-away circuits are conducting.

Another embodiment employs a second transistor residing in the current draw-away circuit. When the second transistor is in the "off" state, the first transistor residing in the current draw-away circuit is conductive and draws a draw-away current, $I_{DRAW}$ When the second transistor is in the "on" state, the first transistor residing in the current draw-away circuit is not conductive.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The components in the figures are not necessarily to scale, emphasis instead being placed upon illustrating the principles of the invention. In the figures, like reference numerals designate corresponding parts throughout the several views.

DETAILED DESCRIPTION

1. Overview of the Invention, the Current Draw-Away Circuit

Conventional amplifiers described above employ various techniques to control the reference current and/or reference voltage so that the output of an amplifier may be adjusted to desired levels. In one embodiment of the invention, a radio frequency (RF) transistor amplifier is employed in the transmitter of a mobile communication device, such as but not limited to, a hand-held cell phone. The invention employs a transistor-based circuit, referred to as the current draw-away circuit, to reduce the bias voltage applied to the base of the RF transistor. The current draw-away circuit diverts a portion of the reference current, $I_{REF}$, away from the current sinking terminal of the reference transistor, that in turn sets the voltage bias on the input control terminal of the RF transistor. Adjusting the input control voltage of the RF transistor results in an adjustment in the RF transistor's quiescent current. Hence, the current draw-away circuit "draws away" a portion of $I_{REF}$, thereby decreasing the RF transistor's quiescent current. Since the reference current and/or voltage applied to the reference transistor is not adjusted externally, the need for additional complex, expensive and power consuming reference current/voltage control circuitry is eliminated. Also, the current draw-away circuit is very small and may even be incorporated onto the amplifier integrated circuit (IC) chip, thereby reducing the overall size of the device.

The current draw-away circuit is coupled to the connection that supplies the reference current, and hence, the bias to the RF transistor. When in the "off" state, the current draw-away circuit is not conducting and does not draw any current. When in the "on" state, the draw-away circuit is conducting and draws a current $I_{DRAW}$. The current $I_{DRAW}$ drawn by the current draw-away circuit decreases the RF transistor bias current because the current draw-away circuit is coupled to the connection that supplies the reference current. That is, the current draw-away circuit "draws-away" a portion of the reference current, thereby reducing the RF transistor bias current. Since an effect of the reduction in RF transistor bias current is to reduce the collector current (or drawn current) drawn by the RF transistor, power drawn by the RF transistor is decreased when the power of the transmitted signal from the mobile communications device is reduced.

2. Bias Control Of Amplifiers

Figure 1:
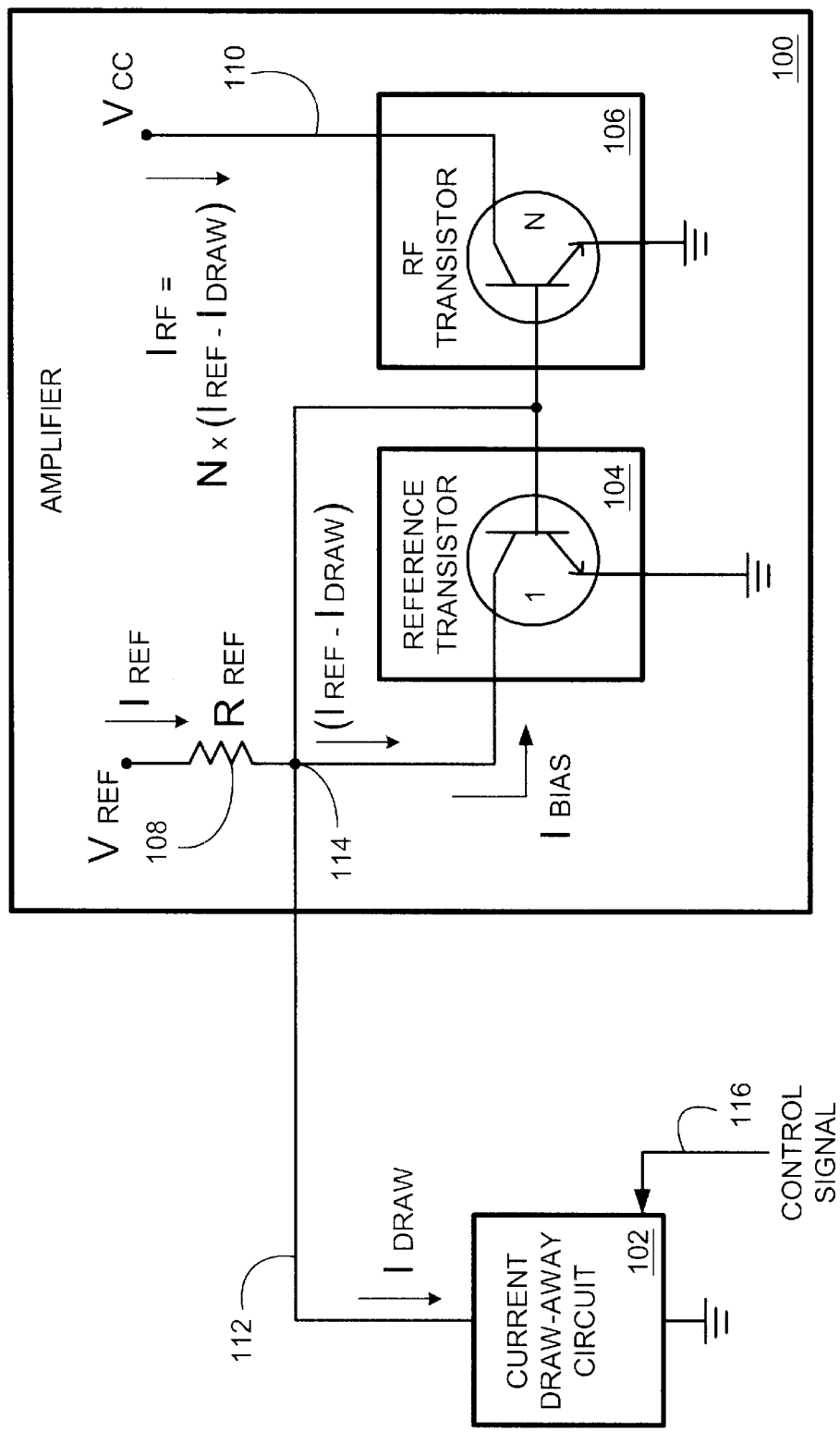
FIG. 1 is a block diagram illustrating an amplifier employing an embodiment of the current draw-away circuit coupled to a conventional amplifier having a reference transistor and a radio frequency (RF) transistor.

FIG. 1 is a block diagram illustrating an amplifier employing an embodiment of the current draw-away circuit 102 coupled to a conventional amplifier 100 having a reference transistor 104 and a radio frequency (RF) transistor 106. A bias current ($I_{BIAS}$) is drawn through the collector of reference transistor 104. A reference resistor 108 ($R_{REF}$) is used to predefine the magnitude of $I_{REF}$. $I_{REF}$ determines the collector current magnitude of RF transistor 106. As is well known in the art, RF transistor collector current, $I_{RF}$, is equal to the reference transistor 104 collector current $I_{REF}$ times an amplification factor, N, where N is the ratio of emitter area between the RF transistor 106 and the reference transistor 104.

Reference transistor 104 is a small transistor relative to the size of RF transistor 106. Currents drawn through the base of reference transistor 104 and the base of RF transistor 106 are sufficiently small so as to be practically ignored when developing the equations below that define the operating characteristics of RF transistor 106. In the case of a draw-away current equaling zero ($I_{DRAW}=0$), the RF transistor current $I_{RF}$ can be closely approximated by equation 1.

$$I_{RF}=N \times (I_{REF}) \tag{1}$$

In this special case ($I_{DRAW}=0$), the operation of amplifier 100 is substantially equivalent to a conventional amplifier.

Devices employing an amplifier 100 typically provide a pre-defined reference voltage, $V_{REF}$, to set the reference current $I_{REF}$ [where $I_{REF}=(V_{REF}-V_{BE})/R_{REF}$ and a voltage applied across the base and emitter ($V_{BE}$) is the turn-on voltage of the bipolar transistor]. Alternatively, some devices may provide a reference current, $I_{REF}$, directly to reference transistor 104.

The collector of RF transistor 106, via connection 110, is connected to a power supply (not shown) that provides the necessary $I_{RF}$ when RF transistor 106 is activated (turned on). This power supply is denoted as collector voltage Vcc. Typically, in a mobile communication device Vcc corresponds to the power supply.

Figure 2:
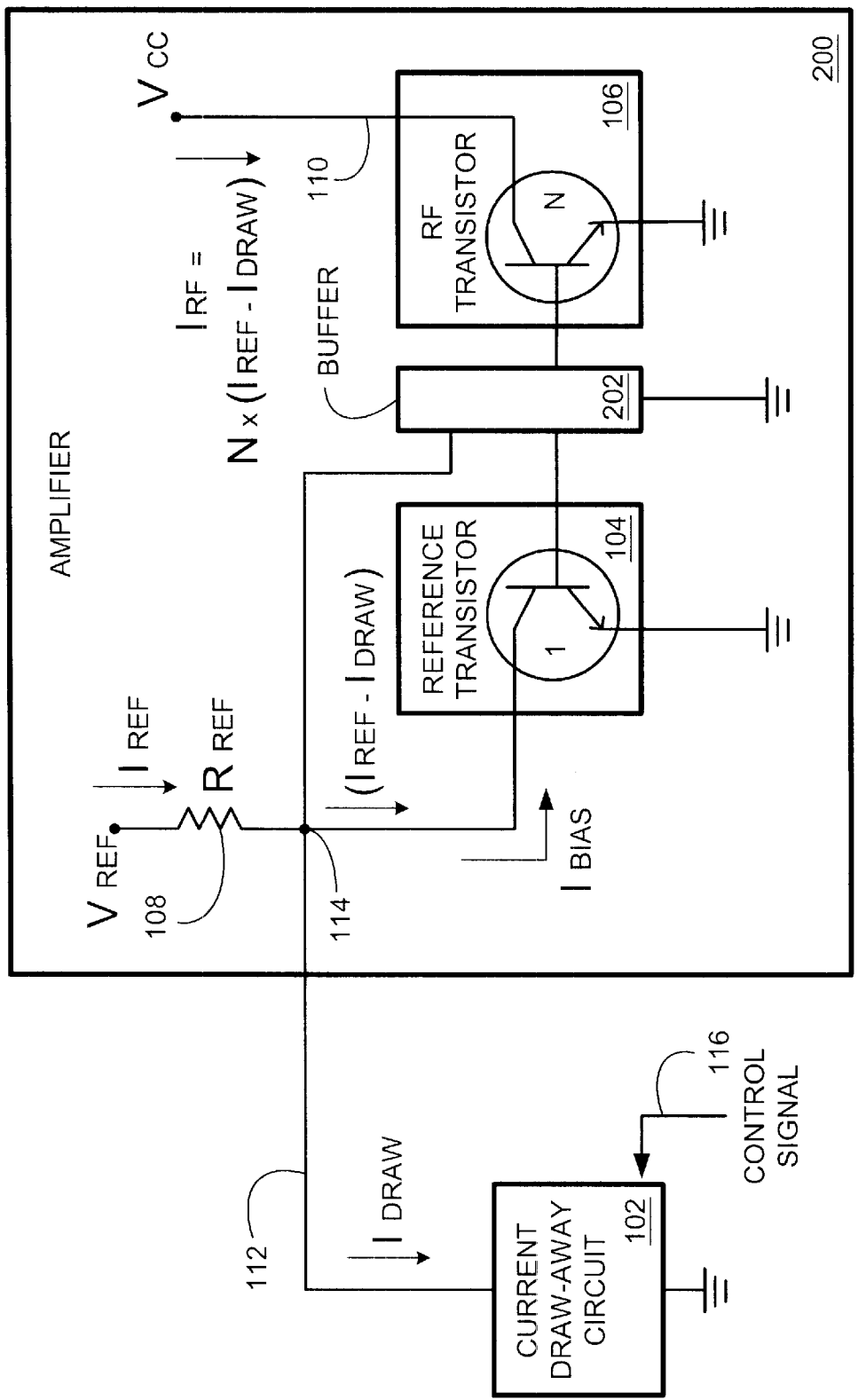
FIG. 2 is a block diagram illustrating an amplifier employing an embodiment of the current draw-away circuit coupled to an amplifier having a reference transistor and a radio frequency (RF) transistor that includes a buffer.

FIG. 2 is a block diagram illustrating an amplifier 200 employing an embodiment of the current draw-away circuit 102 coupled to an amplifier having a reference transistor 104 and a radio frequency (RF) transistor 106 that includes a buffer 202. Amplifier 200 is configured similarly to the amplifier 100 of FIG. 1. However, amplifier 200 includes buffer 202. Buffer 202 may be used to isolate the two transistors 104 and 106 and/or supply base current for the RF transistor 106. The collector current through RF transistor 106, $I_{RF}$, can now be defined by equation 1 above. The functionality and operation of a circuit residing in buffer 202 is well known in the art and is not described in detail.

When a conventional amplifier is employed in the transmitter of a mobile communication device, such as but not limited to, a hand-held cell phone, $I_{REF}$ (or $V_{REF}$) may be varied to adjust $I_{RF}$, thereby controlling the quiescent current ($I_{RFO}$) of the RF transistor 106. For example, when the mobile communication device is nearby a base station receiver, the transmission power may be set to a low value, and a low value of $I_{RFO}$ may be set while meeting all linear performance specifications. When the mobile communication device is further away from the base station receiver, a higher transmitter power may be employed to maintain the link. In this case a higher value of $I_{RFO}$ is required to maintain adequate linear performance. However, additional circuitry in such a conventional amplifier is required to provide for varying $I_{REF}$ (or $V_{REF}$).

3. Orientation of a Current Draw-away Circuit in a Amplifier

FIG. 1 illustrates an embodiment of a current draw-away circuit 102 coupled to amplifier 100. FIG. 2 illustrates a current draw-away circuit 102 coupled to amplifier 200 that includes a buffer circuit 202. Amplifier 200 is configured similarly to amplifier 100 (FIG. 2). For convenience of illustration, the current draw-away circuit is shown separately from amplifiers 100 and 200. Because of the relatively small physical size of current draw-away circuit 102, current draw-away circuit 102 may be included as an integral part of amplifiers 100 and/or 200, thereby reducing the overall size of the mobile communication device that amplifiers 100 and/or 200 are employed. Alternatively, the current draw-away circuit 102 may be provided separately and coupled to amplifiers 100 and 200 in a similar manner as shown in FIGS. 1 and 2.

In FIG. 1, connector 112 couples the current draw-away circuit 102 to the amplifier 100 at node 114. Node 114 is a common node between the reference resistor and the reference transistor. A control signal, described below, is provided to the current draw-away circuit 102 via connection 116. When the control signal is in a first state, the current draw-away circuit 102 is in an "off state." When in the off state, the current draw-away circuit is not conducting and no current is drawn over connection 112. That is, $I_{DRAW}$ is zero and the current applied to the collector of reference transistor 104 is substantially equal to $I_{REF}$.

When the control signal is in a second state, the current draw-away circuit is in an "on state." When in the on state, the current draw-away circuit 102 is conducting. That is, a draw-away current, $I_{DRAW}$, is drawn over connection 112 through the current draw-away circuit 102. Since the current draw-away circuit 102 is coupled to amplifiers 100 and/or 200 at node 114, $I_{DRAW}$ reduces the current drawn through the collector of RF transistor 106 over connection 110.

Equation 2 below defines the relationship between $I_{REF}$, $I_{DRAW}$ and $I_{RF}$.

$$I_{RF}=N\times(I_{REF}-I_{DRAW}) \quad (2)$$

One skilled in the art will realize that with respect to the amplifier 200 shown in FIG. 2, a buffer 202 may be employed to isolate the transistors 104 and 106, or provide base current for RF transistor 106. Here, the operation and functionality of the current draw-away circuit 102 is substantially the same in amplifiers 100 and 200. That is, when in the on condition, the current draw-away circuit 102 is drawing current IIRAW such that the bias current applied to RF transistor 106 is reduced, thereby reducing the collector current $I_{RF}$.

4. Embodiment of a Current Draw-away Circuit Employing a Draw-away Transistor

Figure 3:
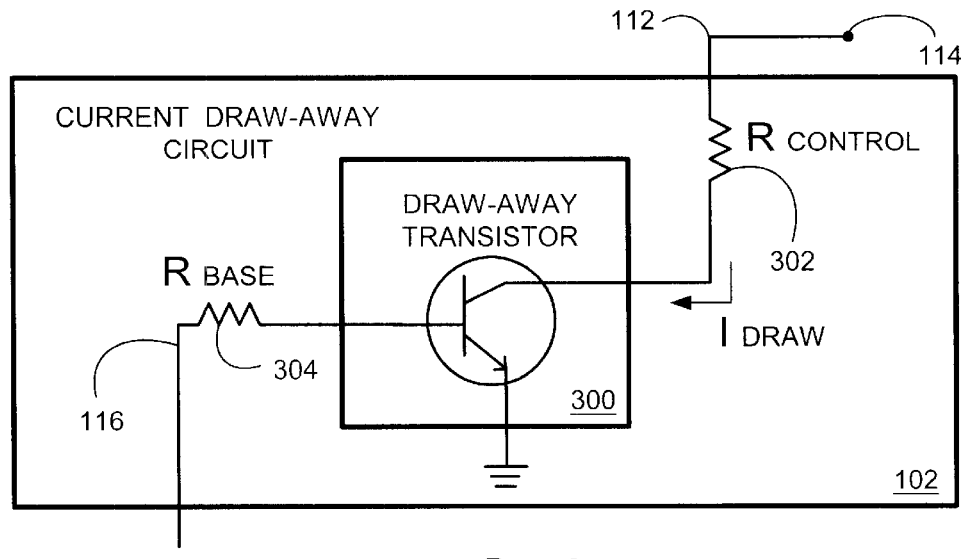
FIG. 3 is a block diagram illustrating a detailed view of an embodiment of the current draw-away circuit.

FIG. 3 is a block diagram illustrating a detailed view of an embodiment of the current draw-away circuit 102 (FIGS. 1 and 2). The current draw-away circuit 102 is coupled to the amplifiers 100, 200 (FIGS. 1 and 2, respectively) at node 114 via connection 112. A single draw-away transistor 300 and a control resistor 302 ($R_{CONTROL}$) are employed in the current draw-away circuit 102. Connection 116 couples the base of draw-away transistor 300 to a control signal that determines the operating condition of the draw-away transistor 300. A base resistor 304, $R_{BASE}$, may be employed to provide protection for the draw-away transistor 300.

When the control signal is in a first state, corresponding to a logical low, zero amps, zero volts or the like, draw-away transistor 300 is in a non-conductive state or an "off state." That is, no current is drawn through the collector of draw-away transistor 300. When in this off state, $I_{DRAW}$ drawn through the current draw-away circuit 102 is substantially zero.

When the control signal is in a second state, such as a logical high, a predefined current, a predefined voltage or the like, the draw-away transistor 300 is conducting. That is, some amount of current is drawn through the collector of draw-away transistor 300.

The magnitude of the draw-away current $I_{DRAW}$ drawn through the current draw-away circuit 102 when the draw-away transistor 300 is conducting is determined by the sizing of the control resistor 302, $R_{CONTROL}$. Thus, the current draw-away circuit 102 can be designed to reduce $I_{RF}$ of the RF transistor 106 (FIGS. 1 and 2) to any pre-defined value. Consequently, the collector current $I_{RF}$ drawn through RF transistor 106 may be defined according to equation 2 by the appropriate sizing of $R_{CONTROL}$ 302.

Figure 4:
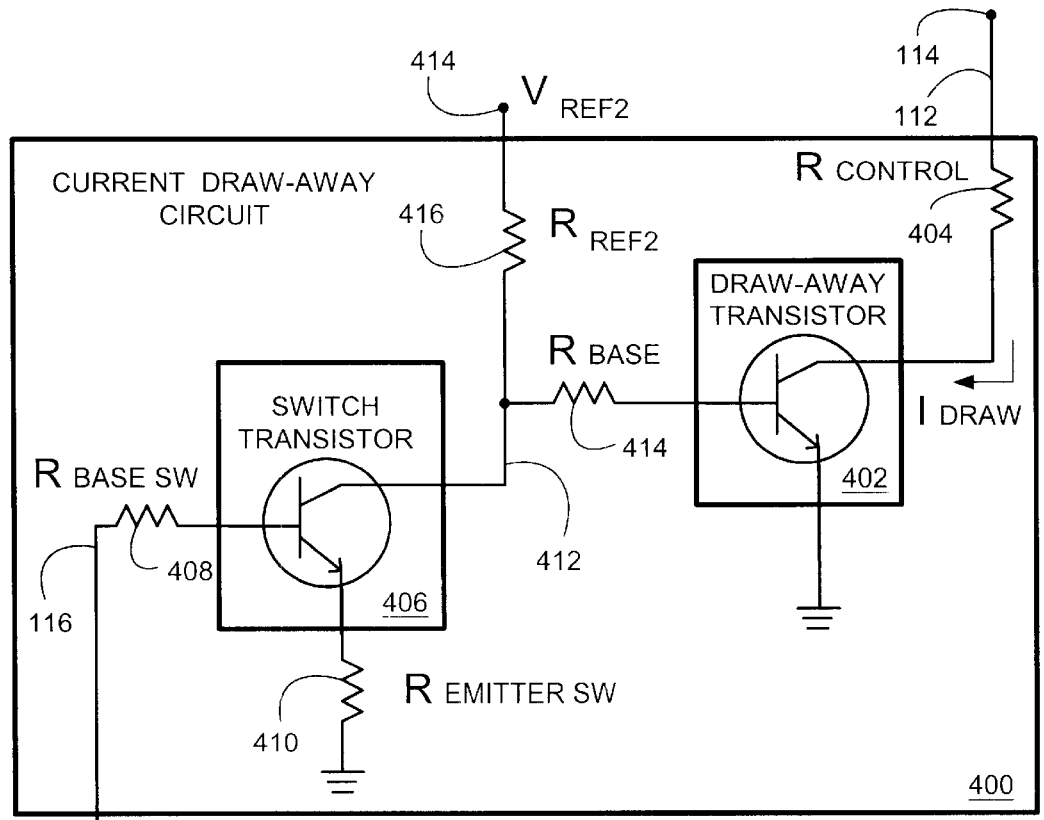
FIG. 4 is a block diagram illustrating a detailed view of another embodiment of the current draw-away circuit.

5. Embodiment of a Current Draw-away Circuit Employing a Draw-away Transistor and a Switch Transistor FIG. 4 is a block diagram illustrating a detailed view of another embodiment of the current draw-away circuit 400. Draw-away circuit 400 employs a draw-away transistor 402, a control resistor 404 ($R_{CONTROL}$) and a switch transistor 406. The current draw-away circuit 400 is coupled to the amplifiers 100, 200 (FIGS. 1 and 2, respectively) at node 114 via connection 112. When compared to the current draw-away circuit 102 (FIG. 3), the current draw-away circuit 400 may be configured to switch on the draw-away transistor 402 with a control signal having the opposite polarity of the control signal that activates (turns on) the draw-away transistor 300 (FIG. 3).

Switch transistor 406 is used to control the operating condition of the draw-away transistor 402. A control signal is provided to the base of switch transistor 406 via connection 116. A switch base resistor 408 ($R_{BASE, SW}$) and a switch emitter resistor 410 ($R_{EMITTER, SW}$) may be used to provide protection for the switch transistor 406. When the control signal is in a first state, such as a logical low, zero voltage or the like, switch transistor 406 is in an "off state" and not conducting current through its collector over connection 412. When switch transistor 406 is in an off condition, the voltage at node 412 is equal to the voltage at node 414 that is equal to $V_{REF2}$. In summary, when the switch transistor 406 is in the off state, draw-away transistor 402 is conducting and drawing $I_{DRAW}$ through connection 112.

When the control signal is in a second state, such as a logical high, a positive voltage or the like, switch transistor 406is conducting. $R_{EMITTER, SW}$ 410 is sized such that when switch transistor 406 is conducting, the voltage at node 412 is substantially equal to zero and/or below the turn-on voltage of the draw-away transistor 402. Thus, when switch transistor 406 has been activated, the draw-away transistor 402 has been deactivated (turned off). One skilled in the art will appreciate that since the voltage at node 412 needs to be substantially zero and/or less than the turn-on voltage of draw-away transistor 402, the value of $R_{EMITTER, SW}$ 410 is preferably sufficiently small so that the desired voltage at node 402 is realized when switch transistor 406 is conducting.

A base resistor ($R_{BASE}$) 414 and a reference resistor ($R_{REF2}$) 416 are employed in the current draw-away circuit 400. Sizing of the resistors $R_{BASE}$ and $R_{REF2}$ are based upon the particular components employed within the current draw-away circuit 400 and the voltage $V_{REF2}$ at node 414. Furthermore, for convenience of illustration, the voltage at node 414 is designated as $V_{REF2}$. Here, $V_{REF2}$ may be equal to $V_{REF}$ (FIGS. 1 and 2).

6. Implementation of a Current Draw-away Circuit

Figure 5:
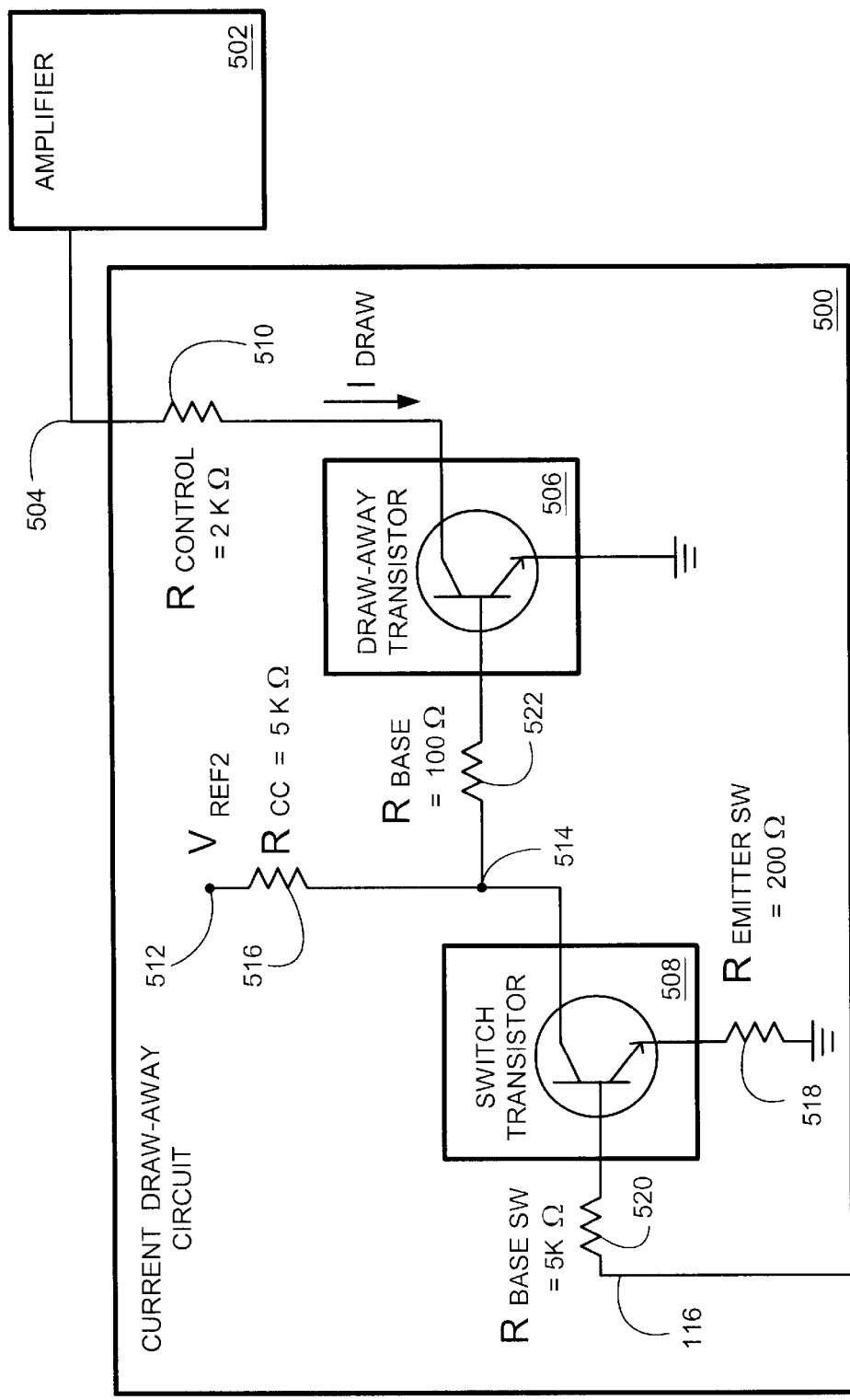
FIG. 5 is a block diagram illustrating a detailed view of another embodiment of the current draw-away circuit having a draw-away transistor and a switch transistor.

FIG. 5 is a block diagram illustrating a detailed view of another embodiment of the current draw-away circuit 500 having a draw-away transistor 506 and a switch transistor 508. Current draw-away circuit 500 is coupled to a amplifier 502 via connection 504. Amplifier 502 may be a amplifier employed in a mobile communication device and substantially corresponds to the amplifiers 100 and/or 200 (FIGS. 1 and 2, respectively). Current draw-away circuit 500 further includes control resistor 510 ($R_{CONTROL}$). $R_{CONTROL}$ is preferably equal to 2 kilo-Ohms ( KΩ). Like the current draw-away circuit 400 (FIG. 4), current draw-away circuit 500 is coupled to a reference voltage ($V_{REF2}$) at node 512. When the switch transistor 508 is in the non-conductive state, voltage at node 514 is substantially equal to $V_{REF2}$. Thus, draw-away transistor 506 is activated and draws a draw-away current $I_{DRAW}$.

When the draw-away transistor 506 is conducting, current is drawn through resistor $R_{CC}$ 516 (preferably 5 KΩ) and resistor $R_{EMITTER, SW}$ 518 (preferably 200 Ω). Because the resistor $R_{EMITTER, SW}$ has a significantly smaller impedance than Resistor $R_{CC}$, the voltage at node 514 when switch transistor 508 is conducting is substantially equal to zero and/or at least less than the turn-on voltage of draw-away transistor 506. Therefore, draw-away transistor 506 is conducting in this operating state and no draw-away current $I_{DRAW}$ is drawn through the current draw-away circuit 500.

The value of $R_{CONTROL}$ 510 is selected such that a current $I_{DRAW}$ of approximately 0.5 milliamps is drawn through the collector of draw-away transistor 506 via connection 116, thereby reducing the collector current of the reference transistor (not shown) from approximately 1.5 milliamps to 1.0 milliamps. When the current draw-away circuit 500 is coupled to the amplifier 502 and a draw-away current $I_{DRAW}$ is drawn through the draw-away transistor 506, the 0.5 milliamp draw-away current causes a reduction in the power drawn by the RF transistor (not shown) by approximately 33% in the illustrative example above.

A switch transistor base resistor 520 ($R_{BASE, SW}$) having a value of 5 KΩ and a base resistor 522 ($R_{BASE}$) having a value of 100Ω provide the necessary protection to the switch transistor 508 and the draw-away transistor 506, respectively.

The above description of the current draw-away circuit 500 describes one possible implementation of a current draw-away circuit. Other implementations of a draw-away circuit could easily be configured to have a current $I_{DRAW}$ of any desired value simply by selecting the appropriately sized resistor $R_{CONTROL}$ 510. Thus, the above-described embodiment in which $I_{DRAW}$ equals approximately 0.5 milliamps and reduces the collector current of the reference transistor from approximately 1.5 milliamps to 1.0 milliamps is merely a non-limiting example of one possible embodiment of the current draw-away circuit 500.

7. Control Signal for a Current Draw-away Circuit

A control signal is provided to the current draw-away circuits 102 and 400 (FIGS. 1–4) via connection 116. The control signal is described as having a first state corresponding to a logical low, a substantially zero voltage, or the like. When the control signal is in the first state, the draw-away transistor is in a substantially nonconducting state and no draw-away current $I_{DRAW}$ is drawn by the draw-away circuit.

The control signal is also described as having a second state corresponding to a logical high, a predefined voltage, or the like. When the control signal is in the second state, the draw-away transistor is conducting and the current draw-away circuit draws a predefined amount of draw-away current ($I_{DRAW}$).

The control signal provided to the current draw-away circuit 500 (FIG. 5) via connection 116 operates in a similar manner as described above. However, the polarity of the control signal is reversed with respect to the polarity of the control signals that operate the current draw-away circuits 102 and 500 (FIGS. 1–4). That is, the draw-away circuit 500 draws a draw-away current when the control signal corresponds to a logical low, a zero voltage, or the like. Conversely, when the control signal applied to current draw-away circuit 500 corresponds to a logical high, a predefined voltage, or the like, the draw-away circuit does not draw a draw-away current $I_{DRAW}$.

The control signal, depending upon the turn-on/turn-off voltage (or current) of the draw-away transistor 300 (FIG. 3) and the switch transistors 406 and 508 (FIGS. 4 and 5, respectively) may be provided by the output of a processor, microprocessor or similar control device. If the turn-on/turn-off voltages (or current) are greater than the output conveniently provided by a processor, microprocessor or the like, auxiliary switching devices may be employed to provide a control signal having the necessary voltage (or current). The exact nature, operation or specification of the device providing the control signal that operates a current draw-away circuit are not necessary to an explanation of the operation and functionality of a current draw-away circuit, other than to the extent already described. Therefore, additional details regarding the above-described control signal are not discussed here in detail. One skilled in the art will appreciate that a suitable control signal can be easily provided and configured to operate a current draw-away circuit.

Furthermore, the status of the control signal may be determined based upon a variety of operating conditions. For example, but not limited to, the output power of a transmitter in a mobile communication device may be selected to be at a high output value when the mobile communication device is far removed from the base station receiver. Alternatively, the output power of the transmitter may be set to a lower level when the mobile communication device is nearby a base station receiver. If these two operating conditions are used as a basis for determining the status of the control signal, the control signal is in a state such that the current draw-away circuit draws no draw-away current $I_{DRAW}$ when the transmitter is transmitting at the high power level (far away from the receiving base station). The control signal is configured to be in a state such that the current draw-away circuit draws $I_{DRAW}$ when the transmitter is operating in the low power state (nearby a base station receiver).

One skilled in the art will appreciate that any number of other various operating conditions could be employed individually, concurrently, or in combination to derive a desired control signal, or a plurality of control signals for other embodiments of the current draw-away circuit as described below. Other non-limiting examples of operating conditions might include changes in operating temperature of the device, changes in the available power supply, or the selection of different transmission frequencies employed by the mobile communication device transmitter. Any such control devices, control schemes and/or control systems employed in a device utilizing a current draw-away circuit are intended to be within the scope of this disclosure and to be protected by the accompanying claims.

8. Alternative Embodiments of An Amplifier Employing a Current Draw-away Circuit For ease and simplification of the explanation of the operation and functioning of the current draw-away circuit coupled to an amplifier circuit, transistors shown in FIGS. 1 through 5 are NPN-type bipolar junction transistors (BJT). The current draw-away away circuit may be employed effectively in any amplifier having an amplification component that is bias controlled. Furthermore, a current draw-away circuit may be configured to control voltage applied to the amplification component. For example, but not limited to, such amplification components may include field effect transistors (FETs), junction type FETs (JFETs), PNP BJTs or other active devices such as a vacuum tube. When these amplification components are employed in an amplifier coupled to a current draw-away circuit, the operation and functionality of the current draw-away circuit remains as described above. That is, the current draw-away circuit operates to reduce the current drawn by the amplification component.

Figure 6:
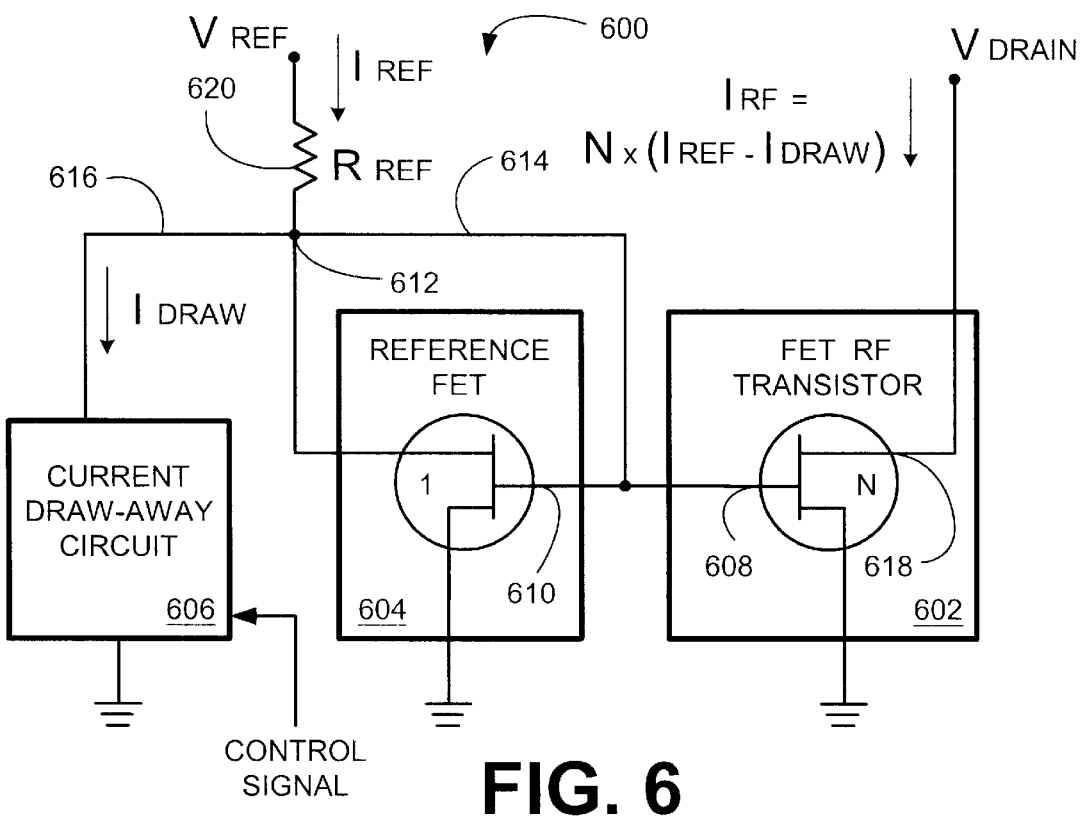
FIG. 6 is a block diagram illustrating an embodiment of the current draw-away circuit adapted to operate within an amplifier having field effect transistors (FETs).

FIG. 6 is a block diagram illustrating an embodiment of the current draw-away circuit 606 adapted to operate with an amplifier 600 having FET type transistors. RF transistor 602 is a FET and a reference transistor 604 is a FET. Here, current draw-away circuit 606 is coupled to the gate 608 of the RF transistor 602 and to the gate 610 of the reference FET 604 at node 612, via connection 614. When the draw-away circuit 606 is conducting, draw-away current $I_{DRAW}$ is drawn into the current draw-away circuit 606 over connection 616, thereby reducing the voltage applied to the gates (608 and 610) of the FET RF 602 and the reference FET 604.

When the voltage applied to the gate 608 of the FET RF transistor 602 is reduced, the FET RF transistor 602 is not conducting. That is, FET RF transistor 602 is off and $I_{RF}$ is zero. Thus, the current draw-away circuit 606 effectively reduces the current drawn through the drain 618 of the RF transistor 602.

FIG. 6 illustrates a reference resistor ($R_{REF}$) 620 coupled between the reference voltage $V_{REF}$ and node 612. Other configurations for amplifiers may not employ $R_{REF}$ 620 in the manner as illustrated in FIG. 6. Furthermore, some configurations of a amplifier may employ the same voltage to $V_{DRAIN}$ and $V_{REF}$. Such alternative configurations of amplifiers may effectively employ the current draw-away circuit. Any such alternative configurations of amplifiers employing the current draw-away circuit are intended to be within the scope of this disclosure and to be protected by the accompanying claims.

9. Alternative Embodiments of a Current Draw-away Circuit

A. Current Draw-away Circuit Employing an FET

Figure 7:
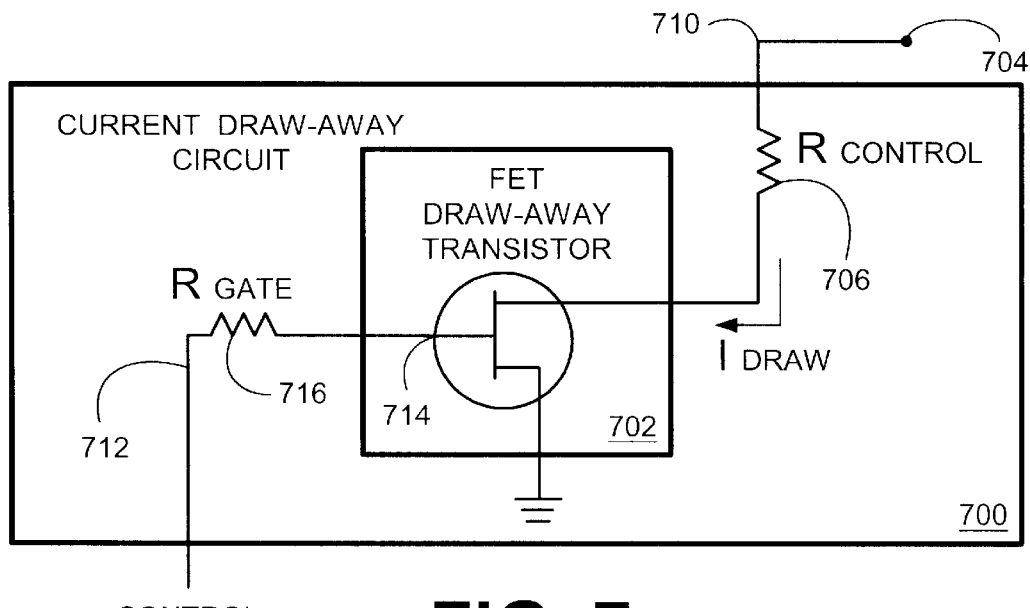
FIG. 7 is a detailed view of an embodiment of the current draw-away circuit employing a FET type draw-away transistor.

FIG. 7 is a detailed view of an embodiment of the current draw-away circuit 700 employing a field effect transistor (FET) type draw-away transistor 702. Like the current draw-away circuit 300 of FIG. 3, the current draw-away circuit 700 is coupled to an amplifier at node 704 (see also FIGS. 1 and 2). The control resistor 706 ($R_{CONTROL}$) has been selected such that when the FET draw-away transistor is conducting, a predefined value of draw-away current $I_{DRAW}$ is drawn into the current draw-away circuit 700 over connection 710. A control signal is provided to the current draw-away circuit 700 by coupling a connector 712 to the gate 714 of the FET draw-away transistor 702. A gate resistor 716 ($R_{GATE}$) may be employed to provide protection to the FET draw-away transistor 702.

When the control signal is in a first state, the voltage applied to the gate 714 of the FET draw-away transistor is substantially zero. When the control signal is in this first state, the FET draw-away transistor 702 is not conducting (draw-away current $I_{DRAW}$ is zero). When the control signal is in a second state, a predefined voltage is applied to the gate 714 of the FET draw-away transistor 702. When the control signal is in the second state, the FET draw-away transistor 702 is conducting ($I_{DRAW}$ equals a predefined value). Since the control and operation of the current draw-away circuit 700 is similar to the operation and control of the current draw-away circuit 102 (FIG. 3), and accordingly, is not described in additional detail.

Other embodiments of a current draw-away circuit may employ other types of transistors, such as but not limited to, JFETs, PNP BJTs, or other appropriately sized active devices such as a vacuum tube electronic valve. Any such alternative embodiments of a current draw-away circuit are intended to be within the scope of this disclosure and to be protected by the accompanying claims.

B. Current Draw-away Circuit Employing a Variable Current and/or Voltage Source

Figure 8:
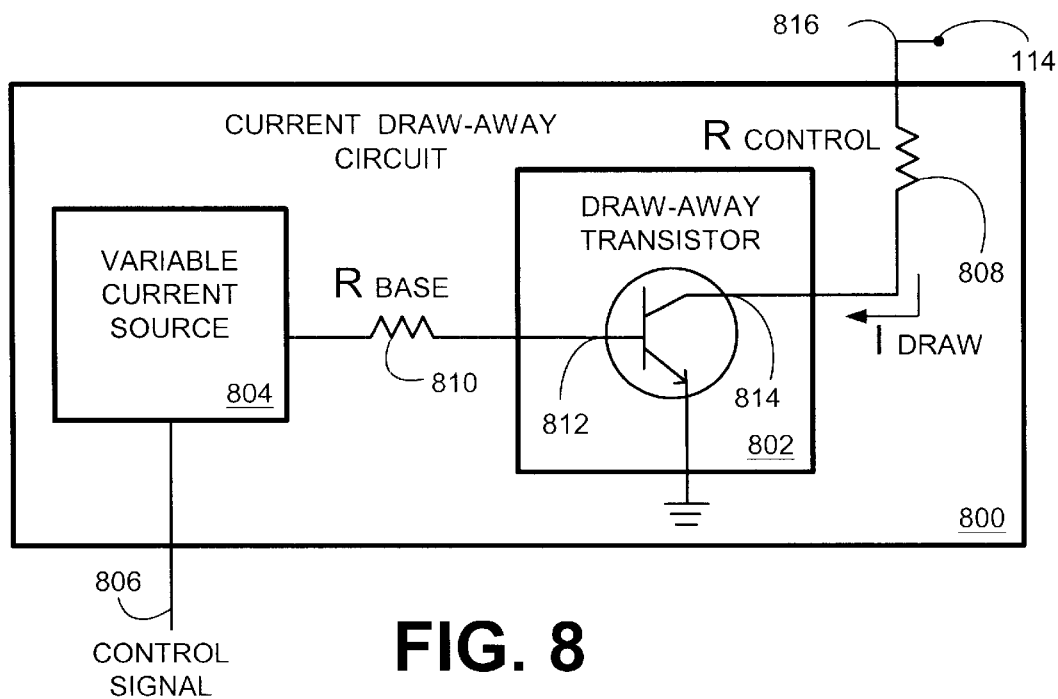
FIG. 8 is a block diagram illustrating a detailed view of an embodiment of the current draw-away circuit employing a variable current source that controls the magnitude of the draw-away current, $I_{DRAW}$.

FIG. 8 is a block diagram illustrating a detailed view of an embodiment of the current draw-away circuit 800 employing a variable current source that controls the magnitude of the draw-away current, $I_{DRAW}$. Current draw-away circuit 800 includes draw-away transistor 802 coupled to a variable current source 804. Here, the draw-away transistor 802 is a transistor capable of controlling its collector current over a linear operating range. A non-limiting example of such a transistor is a BJT. Since the collector current drawn by draw-away transistor 802 corresponds to the draw-away current $I_{DRAW}$, the current draw-away circuit 800 is capable of drawing any value of $I_{DRAW}$, within the linear operating range of the draw-away transistor 802, as determined by a control signal delivered to the current draw-away circuit 800 over connection 806. An optional control resistor 808 ($R_{CONTROL}$) may be employed to further control the draw-away current $I_{DRAW}$. A base resistor 810 ($R_{BASE}$) may be employed to provide protection to the draw-away transistor 802.

The variable current source 804 varies the current applied to the base 812 of the draw-away transistor 802 according to the control signal provided over connection 806. A control system (not shown) determines the desired magnitude of the draw-away current $I_{DRAW}$ and the corresponding current from the variable current source 804 that is to be applied to base 812. Since the current drawn through the collector 814 is proportional to the current applied to the base 812, the draw-away current $I_{DRAW}$, drawn over connection 816, is a variable parameter within the operating range of draw-away transistor 802. Like other previously described embodiments of the current draw-away circuit, the current draw-away circuit 800 is coupled to a node 114 (see also FIGS. 1 and 2).

A current draw-away circuit 800 having a variable current source 804 may be particularly suited to devices that require a variety of power outputs or that require a variable output from an amplifier. A control system (not shown) could define a plurality of specified operating points and provide a control signal over connection 806 to the variable current source 804 such that a corresponding plurality of draw-away currents are drawn through the draw-away transistor 802 according to the particular device operating conditions. Alternatively, the control system (not shown) could specify a particular operating point within a continuous range of operating points that the amplifier is to operate at, and provide a corresponding control signal over connection 806 to the variable current source 804 such that the draw-away transistor 802 is drawing a corresponding draw-away current $I_{DRAW}$ that lies within the operating range of the draw-away transistor 802.

Figure 9:
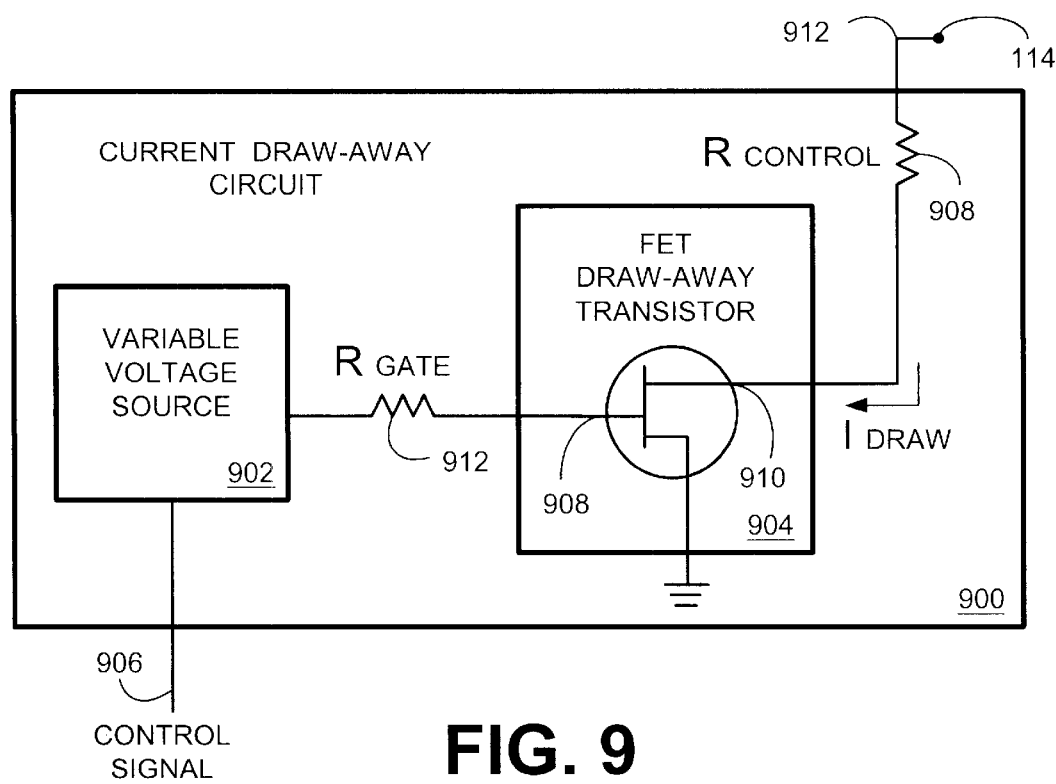
FIG. 9 is a block diagram illustrating a current draw-away circuit employing a variable voltage source applied to a FET type draw-away transistor.

FIG. 9 is a block diagram illustrating a current draw-away circuit 900 employing a variable voltage source 902 applied to a FET type draw-away transistor 904. Such an application of a current draw-away circuit 900 employing a variable voltage source 902 is particularly well suited if a FET draw-away transistor 904 is used in the current draw-away circuit 900. In this particular application, the variable voltage source 902 applies a voltage, in accordance with a control signal provided over connection 906, to the gate 908 of the FET draw-away transistor 904. Since the current drawn through the drain 910 is proportional to the voltage applied to gate 908, the magnitude of the draw-away current $I_{DRAW}$, drawn over connection 912, can be controlled over the linear range of the FET draw-away transistor 904. Thus, amplification in an amplifier can be controlled in a similar manner as described above for a current draw-away circuit 800 (FIG. 8) employing a variable current source 804 (FIG. 8). Like other previously described embodiments of the current draw-away circuit, the current draw-away circuit 900 is coupled to a node 114 (see also FIGS. 1 and 2).

For convenience of illustration and for convenience of explaining the functionality and operation of a current draw-away circuit 800 employing a variable current source 804 (FIG. 8), the variable current source 804 is shown as residing within the current draw-away current 800. The variable current source 804 may reside in alternative convenient locations outside of the current draw-away circuit 800, as components of other systems, or as stand alone dedicated elements without adversely affecting the operation and functionality of the current draw-away circuit 800. Similarly, the variable voltage source 902 (FIG. 9) is shown as residing within the current draw-away circuit 900 (FIG. 9) for convenience of illustration and for convenience of explaining the functionality and operation of a current draw-away circuit 900 employing a variable voltage source 902. Such a variable voltage source 902 may reside in alternative convenient locations outside of the current draw-away circuit 900. All such alternative embodiments of a current draw-away circuit employing a variable current source 804 (FIG. 8), or an alternative embodiment of a current draw-away circuit employing a variable voltage source 902 (FIG. 9), are intended to be within the scope of this disclosure and to be protected by the accompanying claims.

Figure 10:
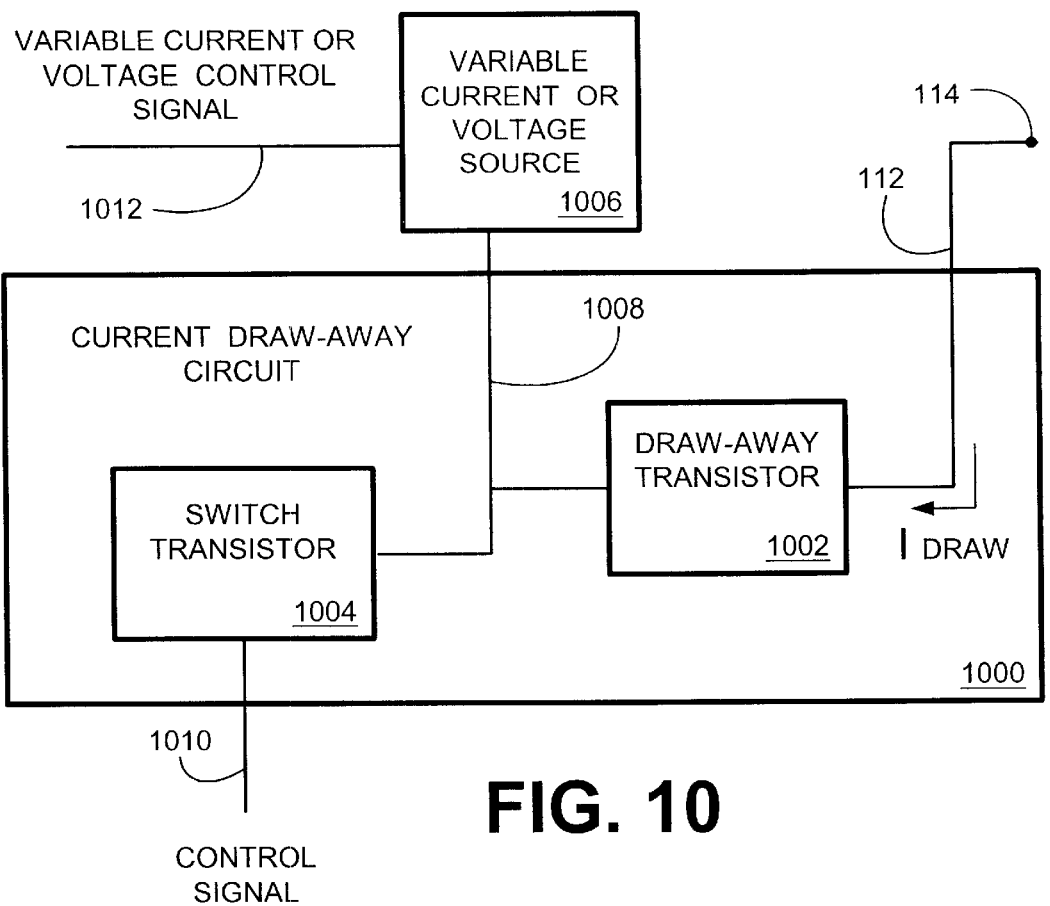
FIG. 10 is a block diagram illustrating a variable current or voltage source applied to a current draw-away circuit.

FIG. 10 is a block diagram illustrating a variable current or voltage source applied to a current draw-away circuit 1000. Current draw-away circuit 1000 is configured substantially in accordance with the current draw-away circuit 500 of FIG. 5. For convenience of illustration and explanation of this embodiment, the resistors (corresponding to the resistors shown in FIG. 5) and the grounding connections of the draw-away transistor 1002 and the switch transistor 1004, are not shown. Current draw-away circuit 1000 operates substantially like the current draw-away circuit S00 (FIG. 5). However, current draw-away circuit 500 employed a substantially constant reference voltage $V_{REF2}$ that controlled the draw-away transistor 506. In this embodiment, a variable current or variable voltage source 1006 provides the bias current or bias voltage to the draw-away transistor 1002 via connector 1008. Here, the selection of a variable current source or a variable voltage source depends upon the specific nature of the draw-away transistor 1002. For example, if the draw-away transistor 1002 was a BJT type transistor, a variable current source could be employed.

If the switch transistor 1004 was not conducting, in accordance with the control signal provided over connection 1010, the variable current or variable voltage provided by variable current or variable voltage source 1006 is provided to the draw-away transistor 1002. Thus, draw-away transistor 1002 is drawing a draw-away current $I_{DRAW}$ through connection 304 as previously described.

When switch transistor 1004 is conducting, in accordance with the control signal provided over connection 1010, a substantially zero voltage is provided to the draw-away transistor 1002 such that the draw-away transistor 1002 is not conducting (turned off). That is, no draw-away current $I_{DRAW}$ is drawn through the draw-away transistor 1002.

With the current draw-away circuit 1000 employing a variable current or voltage source 1006, the magnitude of the draw-away current $I_{DRAW}$ could be varied in accordance with a variable current or voltage control signal provided over connection 1012. The operation and control of the variable current or voltage source 1006 is substantially similar in manner to the above-described embodiments of current draw-away circuit 800 (FIG. 8) or the current draw-away circuit 900 (FIG. 9), and therefore is not described again in detail.

C. Amplifier Controlled by a Plurality of Current Draw-away Circuits

Figure 11:
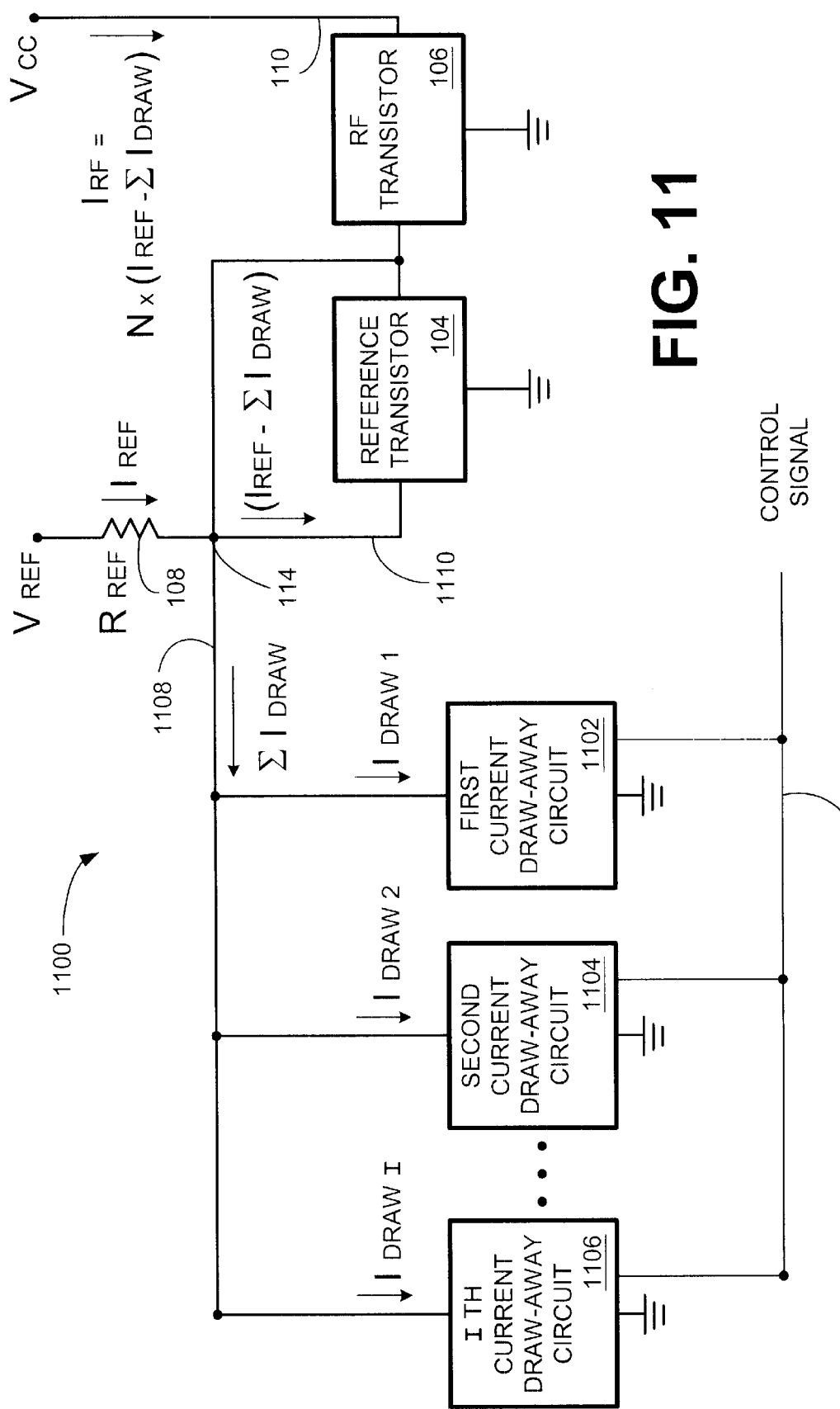
FIG. 11 is a block diagram illustrating a plurality of current draw-away circuits that provide for a variable draw-away current.

FIG. 11 is a block diagram illustrating a plurality of current draw-away circuits 1102, 1104 through 1106 that provide for a variable draw-away current. The current draw-away circuits 1102, 1104 through 1106 are connected at node 114 via bus 1108. The plurality of current draw-away circuits 1102, 1104 through 1106 may include two or more current draw-away circuits such that the current over connection 1110 may be adjusted to any number of values corresponding to the value of the reference current $I_{REF}$ less the draw-away current drawn by any one conducting current draw-away circuit or any combination of conducting current draw-away circuits. In accordance with the process described above, the collector current drawn by the reference transistor $I_{RF}$ is determined according to equation 3 below.

$$I_{RF} = N \times (I_{REF} - \Sigma I_{DRAW}) \quad (3)$$

For convenience of illustration, FIG. 11 illustrates three current draw-away circuits, 1102, 1104 and 1106, coupled to the amplifier 1100 via bus 1108.

From an inspection of the illustrative example circuit configuration according to FIG. 11 having three current draw-away circuits, the RF transistor collector current, $I_{RF}$, can have at least eight different values. Assuming that each of the current draw-away circuits 1102, 1104 and 1106 are configured to draw a different value of draw-away current, $I_{RF}$ is proportional to the reference current, $I_{REF}$, less the draw-away current of the one of the current draw-away circuits 1102, 1104 or 1106 that is conducting.

Three more possible values of $I_{RF}$ can be realized by allowing two of the current draw-away circuits to conduct.

For example, if the first current draw-away circuit 1102 and the second current draw-away circuit 1104 are conducting (Ith current draw-away circuit 1106 is not conducting), then the value of $I_{RF}$ is proportional to the reference current $I_{REF}$ minus $I_{DRAW1}$-$I_{DRAW2}$. If all three current draw-away circuits 1102, 1104 and 1106 are conducting then $I_{BIAS,\ RF}$ is proportional to the reference current $I_{REF}$ minus the three draw-away currents ($I_{DRAW1}$, $I_{DRAW2}$, $I_{DRAW1}$).

The three current draw-away circuits 1102, 1104 and 1106 shown in FIG. 11 were configured to draw different values of draw-away current. Alternatively, each current draw-away circuit 1102, 1104 and 1106 could have been configured to draw the same draw-away current. Furthermore, only two current draw-away circuits could have been employed according to the configuration described above, or more than three current draw-away circuits could have been employed. Thus, the flexibility provided in controlling the RF transistor 104 can be achieved by selecting a any suitable number of current draw-away circuits configured to draw desired draw-away currents and by configuring a control system to operate and selectively control the plurality of current draw-away circuits.

In FIG. 11, a control signal is delivered to the plurality of current draw-away circuits 1102, 1104 and 1106 over connection 1112. The control signal can be provided from any number of sources (not shown) such as, but not limited to, a microprocessor or other suitable processing device. With the configuration shown in FIG. 11, a single connection 1112 provides the control signal to each current draw-away away circuit. Thus, the control system controls each individual current draw-away circuit employing one of any number of control processes commonly employed in the arts. Since the control signaling process that controls each individual current draw-away circuit 1102, 1104 and 1106 may be implemented by these well known control system techniques, a detailed explanation of these techniques in the specification is not provided, nor is such a detailed explanation necessary to understand the functionality and operation of the current draw-away circuit invention. Furthermore, the control signal, as illustrated in FIG. 11, was provided to the current draw-away circuits 1102, 1104 and 1106 over a single connection 1112 for illustrative convenience. Each individual current draw-away circuit could be appropriately controlled by its own unique connection (not shown). These many variations and modifications to a control system for controlling a plurality of current draw-away circuits may be made to the above-described embodiment of the current draw-away circuit invention without departing substantially from the spirit and principles of the current draw-away circuit invention. Any such alternative embodiments of a current draw-away circuit employing such a control system is intended to be within the scope of this disclosure and to be protected by the accompanying claims.

Furthermore, a plurality of current draw-away circuits configured according to FIG. 11, may be employed in an amplifier constructed in accordance with the amplifier 200 (FIG. 2) having a buffer 202 (FIG. 2), in an amplifier 600 (FIG. 6) employing FET transistors, or other amplifier configurations employing the invention. Any such application of a plurality of current draw-away circuits is intended to be within the scope of this disclosure and to be protected by the accompanying claims.

D. Current Draw-away Circuit Employing a Variable Resistance

Figure 12:
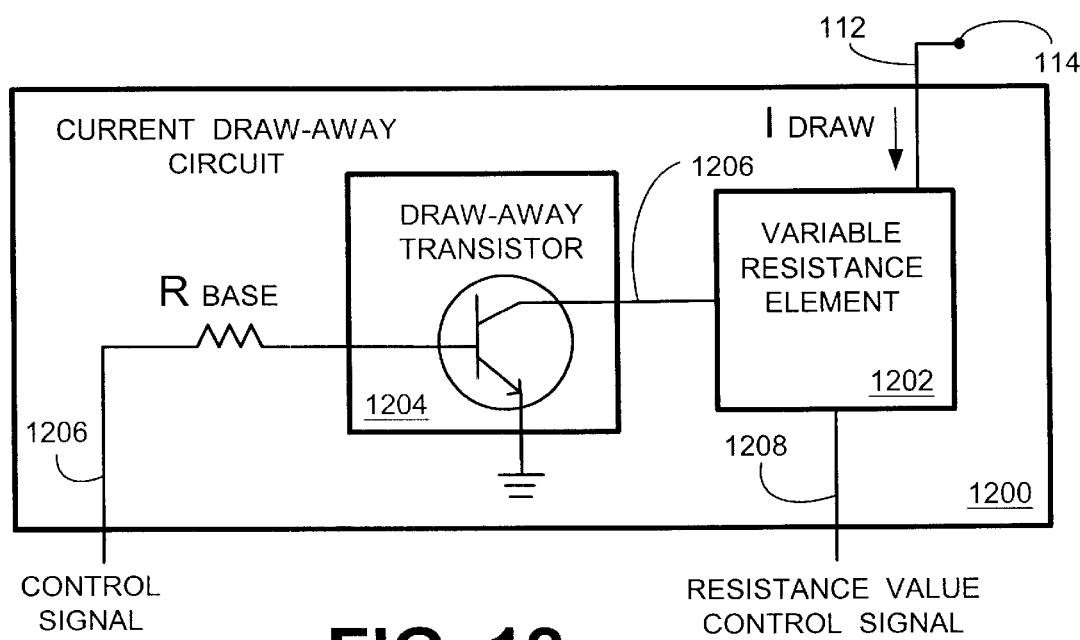
FIG. 12 is a block diagram illustrating a detailed view of an embodiment of the current draw-away circuit employing a variable resistance element that controls the magnitude of the draw-away current, $I_{DRAW}$.

FIG. 12 is a block diagram illustrating a detailed view of an embodiment of the current draw-away circuit 1200 employing a variable resistance element 1202 that controls the magnitude of the draw-away current, $I_{DRAW}$. The embodiment of the invention detailed above includes control resister 302, 408, 510 (FIGS. 3 through 5, respectively) such that the draw-away current $I_{DRAW}$ is set to a predefined value, depending on the particular application that the current draw-away circuit was employed. As illustrated in FIG. 12, a variable resistance element 1202 having variable resistance characteristics is coupled to the draw-away transistor 1204 via connection 1206. The current draw-away circuit 1200 is coupled to the amplifier node 114 via connection 112. When a control signal, via connection 1206, causes the draw-away transistor 1204 to operate in a conductive state, $I_{DRAW}$ is drawn through the current draw-away circuit 1200. The value of the resistance of the variable resistance element 1202 is specified by a resistance value control signal via connection 1208. The resistance value control signal can be provided by a controller (not shown) employing techniques commonly used in the art of control systems. A detailed explanation of such a control system providing the resistance value control signal over connection 1208 is not provided in this specification because such control systems are well known in the art, because the possible configurations of such control systems are too numerous to explain in detail, and because such an explanation is not necessary to an understanding of the operation and functionality of a current draw-away circuit 1200 employing a variable resistance element 1202.

Furthermore, the resistance value control signal may be changed dynamically when the current draw-away circuit 1200 is conducting. That is, the value of $I_{DRAW}$ could be dynamically varied on a real time basis by varying the resistance of the variable resistance element 1202. In this situation, the state of the resistance value control signal may be coordinated with the state of the control signal through a common processing algorithm or the like.

E. Other Alternative Embodiments

While various embodiments of this invention have been described, it will be apparent to those of ordinary skill in the art that many more embodiments and implementations are possible within the scope of this invention.

What is claimed is:

1. A system for controlling transistor current in an amplifier having at least a reference transistor and a reference resistor, comprising:

a resistive element coupled to a common node between the reference resistor and the reference transistor residing in a bias circuit of the amplifier, the reference transistor drawing a reference current such that a quiescent current drawn by the amplifier corresponds to the reference current; and a transistor coupled to the resistive element such that when the transistor is conducting, a current is drawn through the resistive element and the transistor so the reference current is reduced by an amount substantially equal to the current, such that the amplifier quiescent current is reduced by an amount corresponding to the reduced reference current.

2. The system of claim 1, further comprising a connector coupled to the transistor such that the transistor is conducting when a control signal in a first state is transmitted on the connector, and such that the transistor is not conducting when the control signal in a second state is transmitted on the connector.

3. The system of claim 2, wherein the control signal is variable over a continuous predefined range such that the current drawn through the resistive element and the transistor varies in response to the variable control signal, thereby varying the amplifier quiescent current.

4. The system of claim 2, wherein the transistor is a bipolar junction transistor and the control signal corresponds to a bias current applied to a base of the bipolar junction transistor.

5. The system of claim 2, wherein the transistor is a field effect transistor and the control signal corresponds to a gate voltage applied to a gate of the field effect transistor.

6. The system of claim 1, wherein the reference transistor is a bipolar junction transistor having a collector, such that when the reference current is drawn through the collector and when the transistor is conducting, the current reduces the reference current drawn through the collector by an amount substantially equal to the current, thereby reducing the amplifier quiescent current.

7. The system of claim 1, wherein the reference transistor is a field effect transistor having a drain, such that when the reference current is drawn through the drain and when the transistor is conducting, the current reduces the reference current drawn through the drain by an amount substantially equal to the current, thereby reducing the amplifier quiescent current.

8. The system of claim 1, wherein the amplifier is an amplifier residing in a radio frequency (RF) transmitter.

9. The system of claim 1, wherein the resistive element is a resistor.

10. The system of claim 9, wherein the resistor has at least a portion of resistance that is variable such that when the resistance is varied the current drawn through the resistive element and the transistor varies according to the variation of the resistance.

11. The system of claim 10, further comprising a connector coupled to the variable portion of the resistance element such that the resistance is varied in response to a control signal transmitted on the connector.

12. The system of claim 1, further comprising:
a switching transistor coupled to the transistor;
a first connector coupled to the switching transistor such that the switching transistor is conducting when a control signal in a first state is transmitted on the first connector, and such that the switching transistor is not conducting when the control signal in a second state is transmitted on the first connector; and
a second connector coupled between the switching transistor and the transistor such that when the switching transistor is conducting the transistor is not conducting, and such that when the switching transistor is not conducting the transistor is conducting.

13. A system for controlling transistor current, comprising:
a plurality of current draw-away circuits coupled to a reference transistor residing in an amplifier, the reference transistor drawing a reference current such that a quiescent current of the amplifier corresponds to the reference current, and such that each one of the plurality of current draw-away circuits further comprises:
a transistor coupled to a resistive element such that when the transistor is conducting, a current is drawn through the resistive element and the transistor so that the reference current is reduced by an amount substantially equal to the current, such that the amplifier quiescent current is reduced by an amount corresponding to a sum of the currents drawn by each one of the plurality of current draw-away circuits.

14. The system of claim 13, further comprising a plurality of control signal connectors, at least one connector coupled to each one of the plurality of current draw-away circuits, such that a first control signal selectively transmitted on at least one of the control signal connectors selectively determines when the corresponding one of the transistors is conducting, and such that a second control signal selectively transmitted on another at least one of the control signal connectors selectively determines when another corresponding one of the transistors is conducting.

15. A system for controlling transistor current, comprising:
means for providing a reference current to a reference resistor and a reference transistor, the reference resistor and the reference transistor residing in an amplifier, such that a quiescent current of the amplifier corresponds to the magnitude of the reference current;
a resistive element coupled to a common node between the reference resistor and the reference transistor; and
means for actuating a transistor coupled to the resistive element, such that a current conducted through the transistor reduces the reference current by an amount substantially equal to the current, and such that the quiescent current of the amplifier is reduced by an amount corresponding to the reduced reference current.

16. The system of claim 15, further comprising means for providing a control signal in a first state to the transistor such that the transistor is not conducting, and providing the control signal in a second state to the transistor such that the second transistor is conducting.

17. The system of claim 16, further comprising means for varying the control signal such that a magnitude of the current conducted through the transistor varies based upon the variation in the control signal.

18. The system of claim 17, wherein the means for varying varies a voltage associated with the control signal.

19. The system of claim 17, wherein the means for varying varies a current associated with the control signal.

20. The system of claim 16, further comprising means for varying a resistance portion of a resistance element coupled to the transistor such that a magnitude of the current conducted through the transistor is varied based upon the variation in the resistance portion.

21. The system of claim 15, further comprising means for providing a control signal in a first state to a switch transistor such that the transistor is actuated, and means for providing the control signal in a second state to the switch transistor such that the transistor is not actuated.

22. A system for controlling transistor current in an amplifier having at least a reference transistor and a reference resistor, the system comprising:
a transistor coupled to a common node between the reference transistor and the reference resistor;
means for coupling a switching transistor to the transistor; and
means for providing a control signal in a first state to the switching transistor such that the switching transistor is conducting, and providing the control signal in a second state to the switching transistor such that the switching transistor is not conducting, such that the transistor is conducting when the switching transistor is not conducting, and such that the transistor is not conducting when the switching transistor is conducting.

23. A method for controlling transistor current, the method comprising the steps of:
providing a reference current to a reference resistor and a reference transistor residing in an amplifier such that a quiescent current of the amplifier corresponds to the magnitude of the reference current; and actuating a transistor coupled to a resistive element, the resistive element coupled to a common node between the reference resistor and the reference transistor, such that a current conducted through the transistor reduces the reference current by an amount substantially equal to the current, and such that the quiescent current of the amplifier is reduced by an amount corresponding to the reduced reference current.

24. The method of claim 23, further comprising the steps of providing a control signal in a first state to the transistor such that the transistor is not conducting, and providing the control signal in a second state to the transistor such that the second transistor is conducting.

25. The method of claim 24, further comprising the step of varying the control signal such that a magnitude of the current conducted through the transistor varies based upon the variation in the control signal.

26. The method of claim 25, wherein the step of varying the control signal varies a voltage associated with the control signal.

27. The method of claim 25, wherein the step of varying the control signal varies a current associated with the control signal.

28. The method of claim 23, further comprising the step of varying a resistance portion of a resistance element coupled to the transistor such that a magnitude of the current conducted through the transistor is varied based upon the variation in the resistance portion.

29. The method of claim 23, further comprising the steps of:

coupling a switching transistor to the transistor; and providing a control signal in a first state to the switching transistor such that the switching transistor is conducting, and providing the control signal in a second state to the switching transistor such that the switching transistor is not conducting, such that the transistor is conducting when the switching transistor is not conducting, and such that the transistor is not conducting when the switching transistor is conducting.

30. A method for controlling transistor current, comprising the steps of:

providing a reference current to a reference transistor residing in an amplifier such that a quiescent current of the amplifier corresponds to the magnitude of the reference current; and actuating at least one of a plurality of transistors coupled to the amplifier such that a current is conducted through each one of the corresponding actuated transistors, thereby reducing the magnitude of the reference current by an amount substantially equal to a sum of the currents, such that the quiescent current of the amplifier is reduced by an amount corresponding to the reduced reference current.

31. The method of claim 30, further comprising the step of providing to each one of the plurality of transistors a unique control signal, wherein the control signal in a first state actuates the corresponding transistor such that the corresponding transistor is not conducting, and wherein the control signal in a second state actuates the corresponding transistor such that the corresponding transistor is conducting.

32. A system for controlling amplifier power, comprising:

an amplifier having a reference resistor and a reference transistor, the reference resistor and the reference transistor drawing a reference current such that a quiescent current of the amplifier corresponds to the reference current;

a resistive element coupled to a common node between the reference resistor and the reference transistor, a transistor coupled to the resistive element such that when the transistor is conducting a current is drawn through the resistive element and the transistor so that the reference current is reduced by an amount substantially equal to the current, and such that the quiescent current is reduced by an amount corresponding to the reduced reference current.

33. A system for controlling transmitter power, comprising:

a mobile communication device, the mobile communication device further comprising:

a transmitter having an amplifier, the amplifier having a reference resistor and a reference transistor, the reference transistor drawing a reference current such that a quiescent current of the amplifier corresponds to the reference current;

a resistive element coupled to a common node between the reference resistor and the reference transistor;

a transistor coupled to the resistive element such that when the transistor is conducting a current is drawn through the resistive element and the second transistor so that the reference current is reduced by an amount substantially equal to the current, and such that the quiescent current is reduced by an amount corresponding to the reduced reference current.

34. The system for controlling transmitter power in a wireless communication device of claim 33, wherein the wireless communication device is a cellular telephone.

* * * * *